(12) United States Patent
Lu et al.

(10) Patent No.: US 12,205,325 B2
(45) Date of Patent: Jan. 21, 2025

(54) VISION-BASED WAFER PRE-ALIGNMENT PLATFORM AND ALIGNMENT METHOD

(71) Applicant: WUXI XIVI SCIENCE AND TECHNOLOGY CO., LTD., Wuxi (CN)

(72) Inventors: Minjie Lu, Wuxi (CN); Huiping He, Wuxi (CN)

(73) Assignee: WUXI XIVI SCIENCE AND TECHNOLOGY CO., LTD., Wuxi (CN)

( * ) Notice: Subject to any disclaimer, the term of this patent is extended or adjusted under 35 U.S.C. 154(b) by 0 days.

(21) Appl. No.: 18/659,016

(22) Filed: May 9, 2024

(65) Prior Publication Data

US 2024/0289985 A1  Aug. 29, 2024

Related U.S. Application Data

(63) Continuation of application No. PCT/CN2023/127528, filed on Oct. 30, 2023.

(30) Foreign Application Priority Data

Feb. 13, 2023 (CN) .......................... 202310104814.9

(51) Int. Cl.
*G06T 7/73* (2017.01)
*G06T 7/13* (2017.01)
(Continued)

(52) U.S. Cl.
CPC ................. *G06T 7/75* (2017.01); *G06T 7/13* (2017.01); *H01L 21/67259* (2013.01);
(Continued)

(58) Field of Classification Search
CPC ... G06T 7/75; G06T 7/13; G06T 2207/20024; G06T 2207/20036; G06T 2207/30148;
(Continued)

(56) References Cited

U.S. PATENT DOCUMENTS 7,834,293 B2   11/2010   Wile et al.
10,022,696 B2   7/2018   Putnam et al.
(Continued)

FOREIGN PATENT DOCUMENTS

CN   109904105 A   6/2019
CN   114068376 A   2/2022

*Primary Examiner* — Bobbak Safaipour
(74) *Attorney, Agent, or Firm* — True Shepherd LLC; Andrew C. Cheng

(57) ABSTRACT

A vision-based wafer pre-alignment platform and alignment method perform image acquisition and processing based on two groups of binocular cameras. To maintain an outer edge contour of a wafer, an adaptive image denoising method of a wafer image is proposed pertinently. Further, the present disclosure defines edge feature points of the wafer according to shape features of the wafer to form feature points constituting a triangle, facilitating extracting the feature points according to an AAM model and matching the feature points according to an isosceles triangle rule. Finally, a position deviation of the wafer is calculated according to spatial coordinates of the feature points and positions of the feature points, an alignment deviation e is calculated according to the obtained spatial position coordinates of the feature points, and the wafer is pre-aligned based on the deviation value e.

9 Claims, 2 Drawing Sheets

(51) Int. Cl.
  *H01L 21/67* (2006.01)
  *H01L 21/68* (2006.01)
  *H01L 21/687* (2006.01)
(52) U.S. Cl.
  CPC ...... *H01L 21/681* (2013.01); *H01L 21/68764* (2013.01); *H01L 21/68771* (2013.01); *H01L 21/68785* (2013.01); *G06T 2207/20024* (2013.01); *G06T 2207/20036* (2013.01); *G06T 2207/30148* (2013.01)
(58) Field of Classification Search
  CPC ............. H01L 21/67259; H01L 21/681; H01L 21/68764; H01L 21/68771; H01L 21/68785
  See application file for complete search history.

(56) References Cited

U.S. PATENT DOCUMENTS

| | | |
|---|---|---|
| 10,209,250 B2 | 2/2019 | Putnam et al. |
| 2022/0148201 A1* | 5/2022 | Huang ..................... G06T 7/75 |

* cited by examiner

VISION-BASED WAFER PRE-ALIGNMENT PLATFORM AND ALIGNMENT METHOD

CROSS-REFERENCE TO RELATED APPLICATIONS

This application is a continuation of International Patent Application No. PCT/CN2023/127528 with a filing date of Oct. 30, 2023, designating the United States, now pending, and further claims priority to Chinese Patent Application No. 202310104814.9 with a filing date of Feb. 13, 2023. The content of the aforementioned applications, including any intervening amendments thereto, are incorporated herein by reference.

TECHNICAL FIELD

The present disclosure mainly relates to the field of wafer detection, and in particular relates to a vision-based wafer pre-alignment platform and an alignment method.

BACKGROUND ART

Integrated circuit (IC) manufacturing is a high and new technology in the information industry, and the rapid development thereof has already changed people's lives. The IC manufacturing involves processes such as photoetching, etching, oxidation, diffusion, and chemical mechanical polishing. Each process requires different equipment, and a photoetching machine is essential equipment for manufacturing. A wafer pre-alignment apparatus is an important part of the photoetching machine. The wafer pre-alignment apparatus firstly performs primary precise positioning for a wafer, and the positioning precision thereof directly influences a production line.

The existing pre-alignment systems are a mechanical pre-alignment system and an optical pre-alignment system. The mechanical pre-alignment system contacts the wafer directly with a complex mechanism and positions the wafer passively. Since the precision of the system mainly depends on precision of mechanical design manufacturing and precision of a photoelectric detection structure, the mechanical pre-alignment system can only satisfy equipment above a micron level, and is mainly applied to micron-level equipment with low transmission precision requirements.

The research and development of the optical pre-alignment system has become a mainstream. In the optical pre-alignment system, an optical detection instrument is used in cooperation with a simple mechanism to achieve high-precision positioning of a silicon wafer. The system integrates trim detection and center positioning of the silicon wafer, the optical detection instrument detects and records a center offset and a position of a trim or notch of the silicon wafer, and transmits the data to a system controller, and the simple mechanism achieves wafer positioning through linear and rotary movements.

At present, a vision-based pre-alignment vision system also appears. The system detects a silicon wafer edge by adopting a CCD image sensor system, and calculates positions of the center and the notch of the silicon wafer according to a certain algorithm. Although the algorithm is simple, the positioning efficiency and precision are to be further improved.

SUMMARY OF THE INVENTION

To solve the above technical problems of a complex wafer pre-alignment platform structure and low alignment efficiency and precision in the prior art, an object of the present disclosure is to provide a vision-based wafer pre-alignment platform and an alignment method.

The present disclosure is implemented through the following technical solution.

An alignment platform includes vision cameras C1-C4, an upper bearing table, a lower bearing table, an upper wafer to be aligned, a target lower wafer, a base and a fixing frame, wherein the cameras C1 and C2 are taken as a group, and the cameras C3 and C4 are taken as a group. The alignment platform further includes a driving unit for driving the upper and lower bearing tables to move in three spatial directions, and an image processing unit, wherein the upper and lower bearing tables are made of a transparent material. Optionally, both sides of the camera group in the wafer pre-alignment platform further include an auxiliary light source for improving quality of images captured by the cameras.

The above wafer pre-alignment platform performs the following alignment steps:

step 1, performing binocular camera calibration for the camera group including the C1 and C2 and the camera group including the C3 and C4 respectively to obtain internal parameters and external parameters of the cameras in the camera groups, so as to obtain a mapping model from image coordinates to world coordinates;

step 2, before alignment, receiving and taking the upper and lower wafers on the upper and lower bearing tables, respectively;

step 3, starting the camera group including the C1 and C2 to acquire upper wafer images and starting the camera group including the C3 and C4 to acquire lower wafer images, respectively;

step 4, performing image filtering pre-processing for the acquired wafer images; and step 5, analyzing the pre-processed images to obtain edge feature points, so as to perform wafer position alignment, wherein the position alignment includes central point alignment and edge notch label alignment.

Specifically, the step 1 may be performed by the existing camera calibration method, which is not particularly limited in the present disclosure. In the above camera group, an optical axis of the left camera is disposed to be completely parallel to an optical axis of the right camera. The internal parameters and external parameters of the cameras may be calibrated by using a binocular lateral model and a calibration plate, so as to obtain the mapping model from image coordinates to world coordinates. Preferably, in this embodiment, two cameras in the camera group have the same focal lengths and parallel optical axes, and an imaging plane is perpendicular to the optical axes.

Specifically, in the step 2, the driving unit for driving the upper and lower bearing tables to move in three spatial directions may receive and take the upper and lower wafers on the upper and lower bearing tables respectively.

Edge texture information of the wafer plays an important role in subsequent feature point-based positioning and wafer pre-alignment. In the present disclosure, in the image filtering pre-processing of the step 4, an adaptive multiscale morphological filtering method proposed by the present disclosure is adopted to prevent a morphological filter from removing excessive texture structures, which specifically includes: 1) initializing a structure operator S with a pixel size of 5×5, and introducing a Gabor filter for denoising to obtain a signal-to-noise ratio $PR0$ as a reference result; 2) filtering the wafer image, comparing the filter result with a rainy image to obtain a signal-to-noise ratio $PR1$, and comparing PR1 with PR0 to prevent the morphological filter from removing excessive texture edges; if PR1<PR0, it indicating that strong edge information is still present in the morphological filter result, expanding the structure operator to obtain an operator with a larger size, further filtering the wafer image, and continuing to compare PR1 obtained from the weighted filter image with PR0; and 3) finishing the morphological filtering process until PR1>PR0, wherein the obtained weighted filter image is the filtered wafer image.

Specifically, the step 5 includes: extracting wafer feature points P, wherein the feature points include three labeled feature points at the notch, which are defined as notch angular points P1 and P2, and a notch semicircle outer edge midpoint P3, and three edge points at an outer contour of the wafer, which are an intersection point P4 of a line passing through the point P3 and perpendicular to a connection line of the P1 and the P2, and an outer edge of the wafer, a vertex P5 of an isosceles triangle that is formed by the P1, the P4 and the outer edge of the wafer and has a side length of 1, and a vertex P6 of an isosceles triangle formed by the P2, the P4 and the outer edge of the wafer; and calculating a spatial coordinate position of the wafer according to the feature points extracted above, and calculating an alignment deviation e according to the obtained spatial position coordinates of the feature points, and pre-aligning the wafer based on the deviation value e.

The step of extracting the feature points includes obtaining three labeled feature points at the notch and three edge points at the outer contour of the wafer based on edge detection. Preferably, in the present disclosure, a feature point positioning model is obtained by a sample-based supervised training method, and 5000 wafer images are acquired at different angles and labeled with the above six feature points to obtain coordinate information in the image; then, texture data acquisition and standardization of the sample are performed through Delaunay triangle transformation and affine transformation by using the six labeled feature points; shape and texture modeling of the wafer image is performed to establish an AAM subjective performance feature point positioning model; and feature point positioning is performed for the newly acquired wafer image by using the established AAM subjective performance model. In addition, after the sample with the labeled feature points is obtained, the feature points of the wafer may also be detected and positioned through a feature network model based on deep convolution, and a process of training the feature point positioning model is well-known to those skilled in the art.

The obtained feature points are matched according to an isosceles triangle rule, and a plurality of feature points extracted by the camera group constitute a triangle, wherein the isosceles triangle with the minimum area corresponds to the notch angular points P1 and P2, and the notch semicircle outer edge midpoint P3, the point P4 is determined according to the P1, the P2 and the P3, and then the points P5 and P6 are determined according to the isosceles triangle rule.

After the above feature points P1-P6 are obtained, the two cameras in the camera group of the present disclosure have the same internal parameters, and the two cameras C1 and C2 have the same focal lengths and parallel optical axes. In this model, the imaging plane is perpendicular to the optical axes, and in the image coordinate systems of two cameras, x-axes coincide with each other, and y-axes are parallel to each other. The coordinates of each feature point in the three-dimensional space are calculated as follows:

$$x_1 = \frac{b(u_1 - u_0)}{u_1 - u_2},$$

$$y_1 = \frac{ba_x(v_1 - v_0)}{a_y u_1 - u_2},$$

$$z_1 = \frac{ba_x}{u_1 - u_2};$$

wherein, $a_x$, $a_y$, $v_0$ and $u_0$ are all internal parameters of the cameras obtained through camera calibration in the step 1 described above, b refers to a baseline length, $(u_1-u_2)$ refers to a parallax, a point $P1_{C1}$ refers to image coordinates of the point P in the coordinate system of one camera C1 of the camera group, with coordinate values of $(u_1, v_1)$, a point $P1_{C2}$ refers to image coordinates of the wafer feature point P in the coordinate system of the other camera C2 of the camera group, with coordinate values of $(u_2, v_2)$, and three-dimensional spatial coordinates $(x_1, y_1, z_1)$ of any feature point P in the wafer image may be calculated from the image coordinates of the $P1_{C1}$ and the $P1_{C2}$.

Three-dimensional spatial coordinates $(x_i, y_i, z_i)$ corresponding to the feature points P1-P6 are calculated sequentially, wherein i refers to the number of feature points.

After the spatial positions of the feature points in the upper and lower wafers are obtained, a position deviation of the wafer is calculated according to the positions of the feature points, the alignment deviation e is calculated according to the obtained spatial position coordinates of the feature points, and the wafer is pre-aligned based on the deviation value e. In this way, one-time alignment of the central point and the edge notch of the wafer can be achieved, greatly improving the pre-alignment efficiency.

Compared with the prior art, the present disclosure has the following beneficial effects. A new vision-based wafer pre-alignment platform and an alignment method are proposed. The pre-alignment platform and the alignment method perform image acquisition and processing based on two groups of binocular cameras. To maintain the outer edge contour of the wafer, an adaptive image denoising method of the wafer image is proposed pertinently. Further, the present disclosure defines edge feature points of the wafer according to shape features of the wafer to form feature points constituting a triangle, facilitating extracting the feature points according to the AAM model and matching the feature points according to the isosceles triangle rule. Finally, the position deviation of the wafer is calculated according to the spatial coordinates and positions of the feature points, and the alignment deviation e is calculated according to the obtained spatial position coordinates of the feature points, and the wafer is pre-aligned based on the deviation value e. The alignment method of the present disclosure is capable of realizing one-time alignment of the central point and the edge notch of the wafer, greatly improving the pre-alignment efficiency.

Numerals of the drawings are described as follows: 1—camera C1, 2—camera C2, 3—camera C3, 4—camera C4, 5—upper bearing table, 6—lower bearing table, 7—upper wafer, 8—lower wafer, 9—base, and 100—fixing frame.

DESCRIPTION OF EMBODIMENTS

The present disclosure will be further described below in detail in conjunction with accompanying drawings.

A vision-based wafer pre-alignment platform and an alignment method are provided.

The present disclosure is implemented through the following technical solution.

Figure 1:
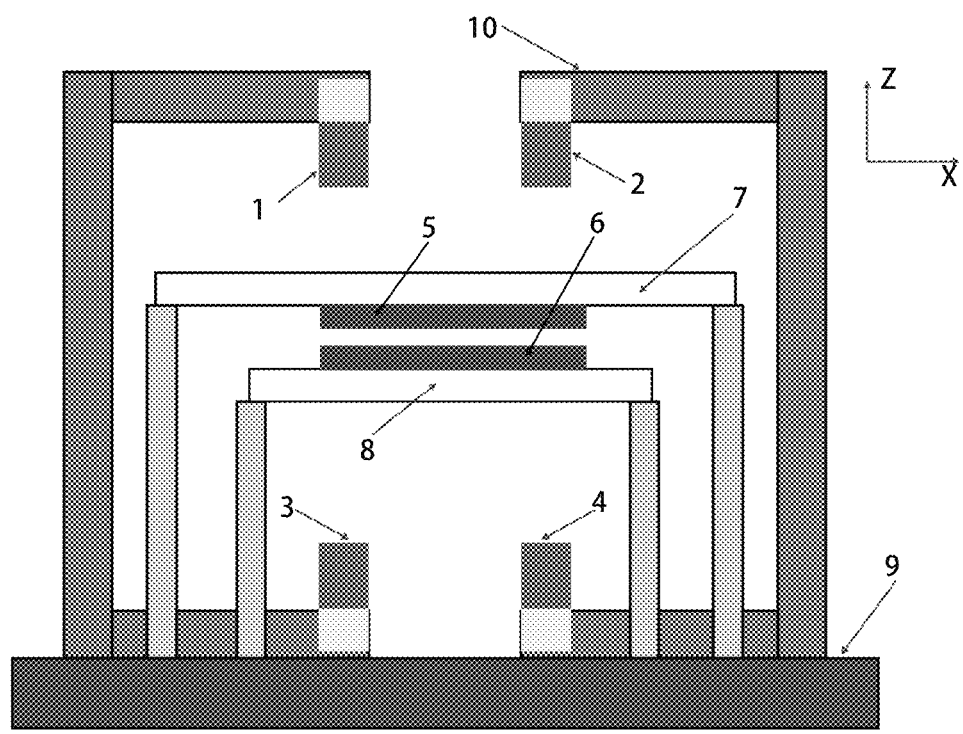
FIG. 1 illustrates a vision-based wafer pre-alignment platform of the present disclosure.

As shown in FIG. 1, an alignment platform includes vision cameras C1-C4, an upper bearing table (5), a lower bearing table (6), an upper wafer to be aligned (7), a target lower wafer (8), a base (9) and a fixing frame (10), wherein the camera C1 (1) and the camera C2 (2) are taken as a group, and the camera C3 (3) and the camera C4 (4) are taken as a group. The alignment platform further includes a driving unit for driving the upper bearing table (5) and the lower bearing table (6) to move in three spatial directions, and an image processing unit, wherein the upper and lower bearing tables are made of a transparent material, and before alignment, it is required to receive and take the upper and lower wafers on the upper and lower bearing tables, respectively. Optionally, both sides of the camera group in the wafer pre-alignment platform further include an auxiliary light source for improving quality of images captured by the cameras.

The above wafer pre-alignment platform performs the following alignment steps:

step 1, performing binocular camera calibration for the camera group including the C1 and C2 and the camera group including the C3 and C4 respectively to obtain internal parameters and external parameters of the cameras in the camera groups, so as to obtain a mapping model from image coordinates to world coordinates;

step 2, before alignment, receiving and taking the upper and lower wafers on the upper and lower bearing tables respectively;

step 3, starting the camera group including the C1 and C2 to acquire upper wafer images and starting the camera group including the C3 and C4 to acquire lower wafer images, respectively;

step 4, performing image filtering pre-processing for the acquired wafer images; and step 5, analyzing the pre-processed images to obtain edge feature points, so as to perform wafer position alignment, wherein the position alignment includes central point alignment and edge notch label alignment.

Specifically, the step 1 may be performed by the existing camera calibration method, which is not particularly limited in the present disclosure. In the above camera group, an optical axis of the left camera is disposed to be completely parallel to an optical axis of the right camera. The internal parameters and external parameters of the cameras may be calibrated by using a binocular lateral model and a calibration plate, so as to obtain the mapping model from image coordinates to world coordinates. Preferably, in this embodiment, two cameras in the camera group have the same focal lengths and parallel optical axes, and an imaging plane is perpendicular to the optical axes.

Specifically, in the step 2, the driving unit for driving the upper and lower bearing tables to move in three spatial directions may receive and take the upper and lower wafers on the upper and lower bearing tables respectively.

Edge texture information of the wafer plays an important role in subsequent feature point-based positioning and wafer pre-alignment. In the present disclosure, in the image filtering pre-processing of the step 4, an adaptive multiscale morphological filtering method proposed by the present disclosure is adopted to prevent a morphological filter from removing excessive texture structures, which specifically includes: 1) initializing a structure operator S with a pixel size of 5×5, and introducing a Gabor filter for denoising to obtain a signal-to-noise ratio PR0 as a reference result; 2) filtering the wafer image, comparing the filter result with a rainy image to obtain a signal-to-noise ratio PR1, and comparing PR1 with PR0 to prevent the morphological filter from removing excessive texture edges; if PR1<PR0, it indicating that strong edge information is still present in the morphological filter result, expanding the structure operator to obtain an operator with a larger size, further filtering the wafer image, and continuing to compare PR1 obtained from the weighted filter image with PR0; and 3) finishing the morphological filtering process until PR1>PR0, wherein the obtained weighted filter image is the filtered wafer image.

Figure 2:
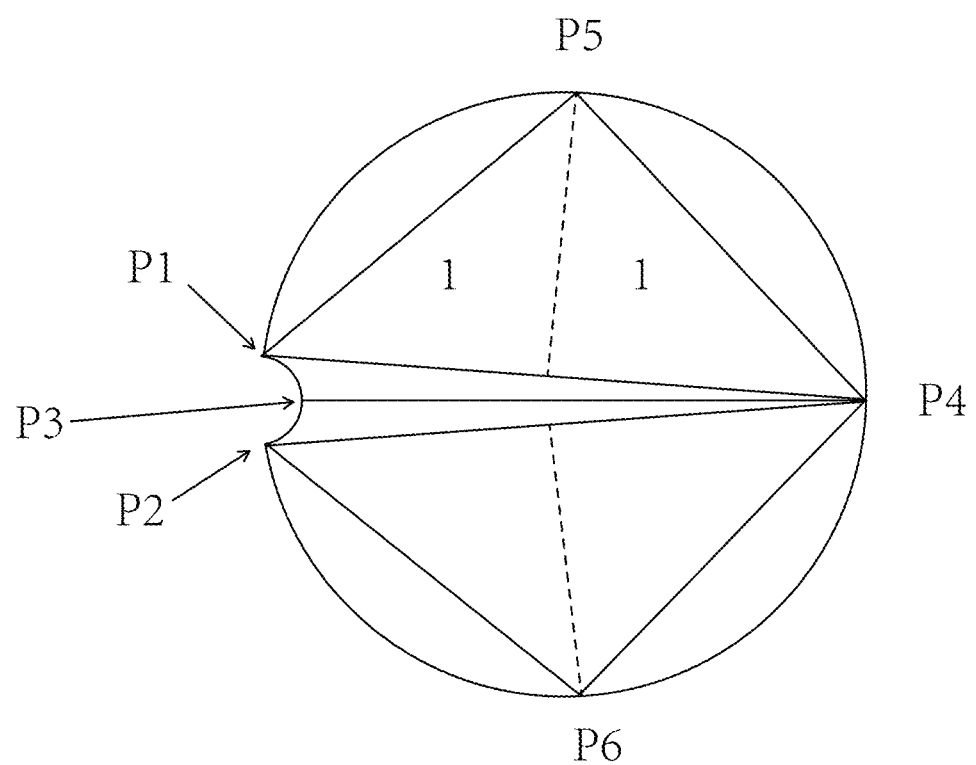
FIG. 2 is a schematic diagram of feature points labeled on a wafer image of the present disclosure.

As shown in FIG. 2, the step 5 specifically includes: extracting wafer feature points P, wherein the feature points include three labeled feature points at the notch, which are defined as notch angular points P1 and P2, and a notch semicircle outer edge midpoint P3, and three edge points at an outer contour of the wafer, which are an intersection point P4 of a line passing through the point P3 and perpendicular to a connection line of the P1 and the P2, and an outer edge of the wafer, a vertex P5 of an isosceles triangle that is formed by the P1, the P4 and the outer edge of the wafer and has a side length of 1, and a vertex P6 of an isosceles triangle formed by the P2, the P4 and the outer edge of the wafer; and calculating a spatial coordinate position of the wafer according to the feature points extracted above, and calculating an alignment deviation e according to the obtained spatial position coordinates of the feature points, and pre-aligning the wafer based on the deviation value e.

The step of extracting the feature points includes obtaining three labeled feature points at the notch and three edge points at the outer contour of the wafer based on edge detection. Preferably, in the present disclosure, a feature point positioning model is obtained by a sample-based supervised training method, and 5000 wafer images are acquired at different angles and labeled with the above six feature points to obtain coordinate information in the image; then, texture data acquisition and standardization of the sample are performed through Delaunay triangle transformation and affine transformation by using the six labeled feature points; shape and texture modeling of the wafer image is performed to establish an AAM subjective performance feature point positioning model; and feature point positioning is performed for the newly acquired wafer image by using the established AAM subjective performance model. In addition, after the sample with the labeled feature points is obtained, the feature points of the wafer may also be detected and positioned through a feature network model based on deep convolution, and a process of training the feature point positioning model is well-known to those skilled in the art.

The obtained feature points are matched according to an isosceles triangle rule, and a plurality of feature points extracted by the camera group constitute a triangle, wherein the isosceles triangle with the minimum area corresponds to the notch angular points P1 and P2, and the notch semicircle outer edge midpoint P3, the point P4 is determined according to the P1, the P2 and the P3, and then the points P5 and P6 are determined according to the isosceles triangle rule.

After the above feature points P1-P6 are obtained, the two cameras in the camera group of the present disclosure have the same internal parameters, and the two cameras C1 and C2 have the same focal lengths and parallel optical axes. In this model, the imaging plane is perpendicular to the optical axes, and in the image coordinate systems of two cameras, x-axes coincide with each other, and y-axes are parallel to each other. The coordinates of each feature point in the three-dimensional space are calculated as follows:

$$x_1 = \frac{b(u_1 - u_0)}{u_1 - u_2},$$

$$y_1 = \frac{ba_x(v_1 - v_0)}{a_y u_1 - u_2},$$

$$z_1 = \frac{ba_x}{u_1 - u_2};$$

wherein, $a_x$, $a_y$, $v_0$ and $u_0$ are all internal parameters of the cameras obtained through camera calibration in the step 1 described above, b refers to a baseline length, ($u_1$-$u_2$) refers to a parallax, a point $P1_{C1}$ refers to image coordinates of the point P in the coordinate system of one camera C1 of the camera group, with coordinate values of ($u_1$, $v_1$), a point $P1_{C2}$ refers to image coordinates of the wafer feature point P in the coordinate system of the other camera C2 of the camera group, with coordinate values of ($u_2$, $v_2$), and three-dimensional spatial coordinates ($x_1$, $y_1$, $z_1$) of any feature point P in the wafer image may be calculated from the image coordinates of the $P1_{C1}$ and the $P1_{C2}$.

Three-dimensional spatial coordinates ($x_i$, $y_i$, $z_i$) corresponding to the feature points P1-P6 are calculated sequentially, wherein i refers to the number of feature points.

After the spatial positions of the feature points in the upper and lower wafers are obtained, a position deviation of the wafer is calculated according to the positions of the feature points, the alignment deviation e is calculated according to the obtained spatial position coordinates of the feature points, and the wafer is pre-aligned based on the deviation value e. In this way, one-time alignment of the central point and the edge notch of the wafer can be achieved, greatly improving the pre-alignment efficiency.

In addition, the present disclosure further provides a computer device and a computer-readable storage medium corresponding to the vision-based wafer pre-alignment method. The device includes a processor and a memory, wherein the memory stores computer-executable instructions executable by the processor, and the processor executes the computer-executable instructions to implement the above pre-alignment method.

In the description of the present disclosure, it is to be noted that, terms "interconnect" and "connect" shall be broadly understood, unless otherwise clearly specified and defined. For example, the connection may be a fixed connection, a detachable connection, or an integrated connection; the connection may be a mechanical connection, or an electrical connection; and the connection may be a direct connection, or an indirect connection through an intermediate medium. Those of ordinary skill in the art may understand specific meanings of the above terms in the present disclosure according to specific situations.

In the description of the present disclosure, unless otherwise stated, an orientation or position relationship indicated by terms such as "upper", "lower", "left", "right", "inside" and "outside" is an orientation or position relationship shown based on the accompanying drawings. These terms are only used to facilitate describing the present disclosure and simplifying the description rather than indicate or imply that an indicated apparatus or element should have a particular orientation or be constructed and operated in the particular orientation, and thus shall not be understood as limiting to the present disclosure.

It is finally to be noted that the above technical solution is only an embodiment of the present disclosure. Based on the application methods and principles disclosed in the present disclosure, those skilled in the art may easily make various improvements or alterations rather than be limited to the methods described in the above specific embodiments of the present disclosure. Therefore, the foregoing embodiments are only preferred and not restrictive.

What is claimed is:

1. A vision-based wafer pre-alignment platform, comprising:
    vision cameras C1-C4,
    an upper bearing table,
    a lower bearing table,
    an upper wafer to be aligned,
    a target lower wafer, a base,
    a fixing frame,
    a driving unit for driving the upper and lower bearing tables to move in three spatial directions, and
    an image processing unit;
    wherein the cameras C1 and C2 are taken as a group, and the cameras C3 and C4 are taken as a group; the upper and lower bearing tables are made of a transparent material; and the above pre-alignment platform performs the following alignment steps:
    step 1, performing binocular camera calibration for the camera group comprising the C1 and the C2 and the camera group comprising the C3 and the C4 respectively to obtain internal parameters and external parameters of the cameras in the camera groups, so as to obtain a mapping model from image coordinates to world coordinates;
    step 2, before alignment, receiving and taking the upper and lower wafers on the upper and lower bearing tables, respectively;
    step 3, starting the camera group comprising the C1 and the C2 to acquire upper wafer images and starting the camera group comprising the C3 and the C4 to acquire lower wafer images, respectively;
    step 4, performing image filtering pre-processing for the acquired wafer images; and
    step 5, analyzing the pre-processed images to obtain edge feature points, so as to perform wafer position alignment, wherein the position alignment comprises central point alignment and edge notch label alignment;
    the step 5 comprises: extracting wafer feature points P, wherein the feature points comprise three labeled feature points at a notch, which are defined as notch angular points P1 and P2, and a notch semicircle outer edge midpoint P3, and three edge points at an outer contour of the wafer, which are an intersection point P4 of a line passing through the point P3 and perpendicular to a connection line of the P1 and the P2, and an outer edge of the wafer, a vertex P5 of an isosceles triangle that is formed by the P1, the P4 and the outer edge of the wafer and has a side length of l, and a vertex P6 of an isosceles triangle formed by the P2, the P4 and the outer edge of the wafer; and calculating a spatial coordinate position of the wafer according to the feature points extracted above, and calculating an alignment deviation e according to the obtained spatial position coordinates of the feature points, and pre-aligning the wafer based on the alignment deviation e.

2. The vision-based wafer pre-alignment platform according to claim 1, further comprising an auxiliary light source for improving quality of images captured by the cameras, wherein the auxiliary light source is respectively arranged at two sides of each of the two camera groups.

3. The vision-based wafer pre-alignment platform according to claim 2, wherein two cameras in the camera group have identical internal parameters, equal focal lengths and parallel optical axes, an imaging plane is perpendicular to the optical axes; and in image coordinate systems of two cameras, x-axes coincide with each other, and y-axes are parallel to each other.

4. The vision-based wafer pre-alignment platform according to claim 3, wherein, in the image filtering pre-processing of the step 4, an adaptive multiscale morphological filtering method is adopted and specifically performed as follows: 1) initializing a structure operator S in a pixel size of 5×5, and introducing a Gabor filter for denoising to obtain a signal-to-noise ratio PR0 as a reference result; 2) filtering the wafer image, comparing the filter result with a rainy image to obtain a signal-to-noise ratio PR1, and comparing PR1 with PR0 to prevent a morphological filter from removing excessive texture edges; if PR1<PR0, it indicating that strong edge information is still present in the morphological filter result, expanding the structure operator to obtain an operator with a larger size, further filtering the wafer image, and continuing to compare PR1 obtained from the weighted filter image with PR0; and 3) finishing the morphological filtering process until PR1>PR0, wherein the obtained weighted filter image is the filtered wafer image.

5. The vision-based wafer pre-alignment platform according to claim 4, wherein the obtained feature points are matched according to an isosceles triangle rule, and a plurality of feature points extracted by the camera group constitute a triangle, wherein the isosceles triangle with the minimum area corresponds to the notch angular points P1 and P2, and the notch semicircle outer edge midpoint P3, the point P4 is determined according to the P1, the P2 and the P3, and then the points P5 and P6 are determined according to the isosceles triangle rule.

6. The vision-based wafer pre-alignment platform according to claim 5, wherein the coordinates of each feature point in three-dimensional space are calculated as follows:

$$x_1 = \frac{b(u_1 - u_0)}{u_1 - u_2},$$

$$y_1 = \frac{ba_x(v_1 - v_0)}{a_y u_1 - u_2},$$

$$z_1 = \frac{ba_x}{u_1 - u_2};$$

wherein $a_x$, $a_y$, $v_0$ and $u_0$ are all internal parameters of the cameras obtained through camera calibration in the step 1 described above, b refers to a baseline length, $(u_1-u_2)$ refers to a parallax, a point $P1_{C1}$ refers to image coordinates of the point P in the coordinate system of one camera C1 of the camera group, with coordinate values of $(u_1, v_1)$, a point $P1_{C2}$ refers to image coordinates of the wafer feature point P in the coordinate system of the other camera C2 of the camera group, with coordinate values of $(u_2, v_2)$, and three-dimensional spatial coordinates $(x_1, y_1, z_1)$ of any feature point P in the wafer image may be calculated from the image coordinates of the $P1_{C1}$ and the $P1_{C2}$.

7. The vision-based wafer pre-alignment platform according to claim 6, wherein three-dimensional spatial coordinates $(x_i, y_i, z_i)$ corresponding to the feature points P1-P6 are calculated sequentially, i being the number of feature points; and after the spatial positions of the feature points in the upper and lower wafers are obtained, a position deviation of the wafer is calculated according to the positions of the feature points, the alignment deviation e is calculated according to the obtained spatial position coordinates of the feature points, and the wafer is pre-aligned based on the alignment deviation e.

8. A computer device, comprising a processor and a memory, wherein the memory stores computer-executable instructions executable by the processor, and the processor executes the computer-executable instructions to implement a method corresponding to the vision-based wafer pre-alignment platform according to claim 1.

9. A non-transitory computer-readable storage medium, wherein the computer-readable storage medium stores computer-executable instructions, and the computer-executable instructions, when invoked and executed by a processor, cause the processor to implement a method corresponding to the vision-based wafer pre-alignment platform claim 1.

* * * * *